United States Patent [19]

Bigelow

[11] 4,233,593
[45] Nov. 11, 1980

[54] CAPACITIVE TOUCH CONTROL AND DISPLAY

[75] Inventor: John E. Bigelow, Clifton Park, N.Y.

[73] Assignee: General Electric Company, Schenectady, N.Y.

[21] Appl. No.: 914,373

[22] Filed: Jun. 12, 1978

Related U.S. Application Data

[63] Continuation-in-part of Ser. No. 879,368, Feb. 21, 1978, Pat. No. 4,158,216.

[51] Int. Cl.² .......................... G06F 3/02; H01H 19/00
[52] U.S. Cl. ............................ 340/365 C; 340/870.37; 340/347 P; 361/280; 361/300
[58] Field of Search ................ 340/365 C, 200, 365 S, 340/347 M, 347 P, 203; 200/DIG. 1, 52 R; 361/280, 292, 298, 299, 300, 287; 324/61 R, 60 C

[56] References Cited

U.S. PATENT DOCUMENTS

| | | | |
|---|---|---|---|
| 3,068,457 | 12/1962 | Nevius | 340/200 |
| 3,198,937 | 8/1965 | Wooster | 340/200 |
| 3,222,668 | 12/1965 | Lippel | 340/347 P |
| 3,760,392 | 9/1973 | Stich | 340/200 |
| 3,863,235 | 1/1975 | McKee et al. | 340/203 |
| 3,924,177 | 12/1965 | Lemineur et al. | 340/200 |
| 4,007,454 | 2/1977 | Cain et al. | 340/200 |
| 4,058,765 | 11/1977 | Richardson et al. | 340/200 |

Primary Examiner—John W. Caldwell, Sr.
Assistant Examiner—James J. Groody
Attorney, Agent, or Firm—Geoffrey H. Krauss; Marvin Snyder; James C. Davis

[57] ABSTRACT

A control for use upon a solid panel, devoid of control shaft apertures, allows data entry by rotational positioning of a sector-shaped electrode to vary the capacitance to at least one of a plurality of sector-shaped electrodes formed about a central disc upon an interior surface of the panel. A magnetizable disk is attached to the exterior of the panel, with the control knob having a magnetized member attracted to the disk for maintaining the control knob in proper position while allowing control knob rotational adjustments. Position-decoding electronics energize successive ones of the plurality of electrodes with successive phases of a master signal and recover zero-crossing information relating the phase of the signal returned from the control to the control position. A light-emitting display is positioned behind the panel to indicate the index of the control knob by a variable-length circular bar of light, a digitized display and the like.

13 Claims, 13 Drawing Figures

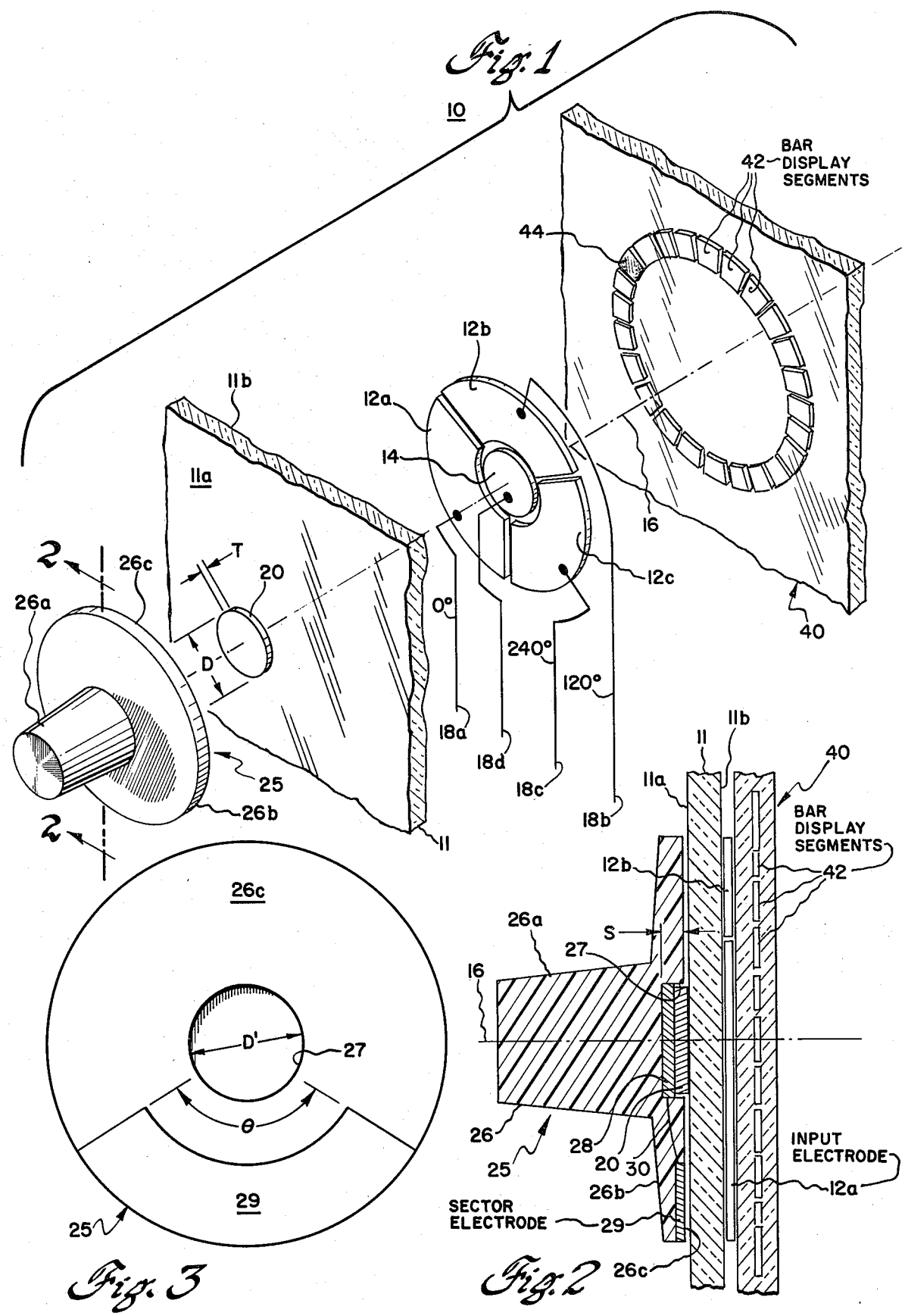

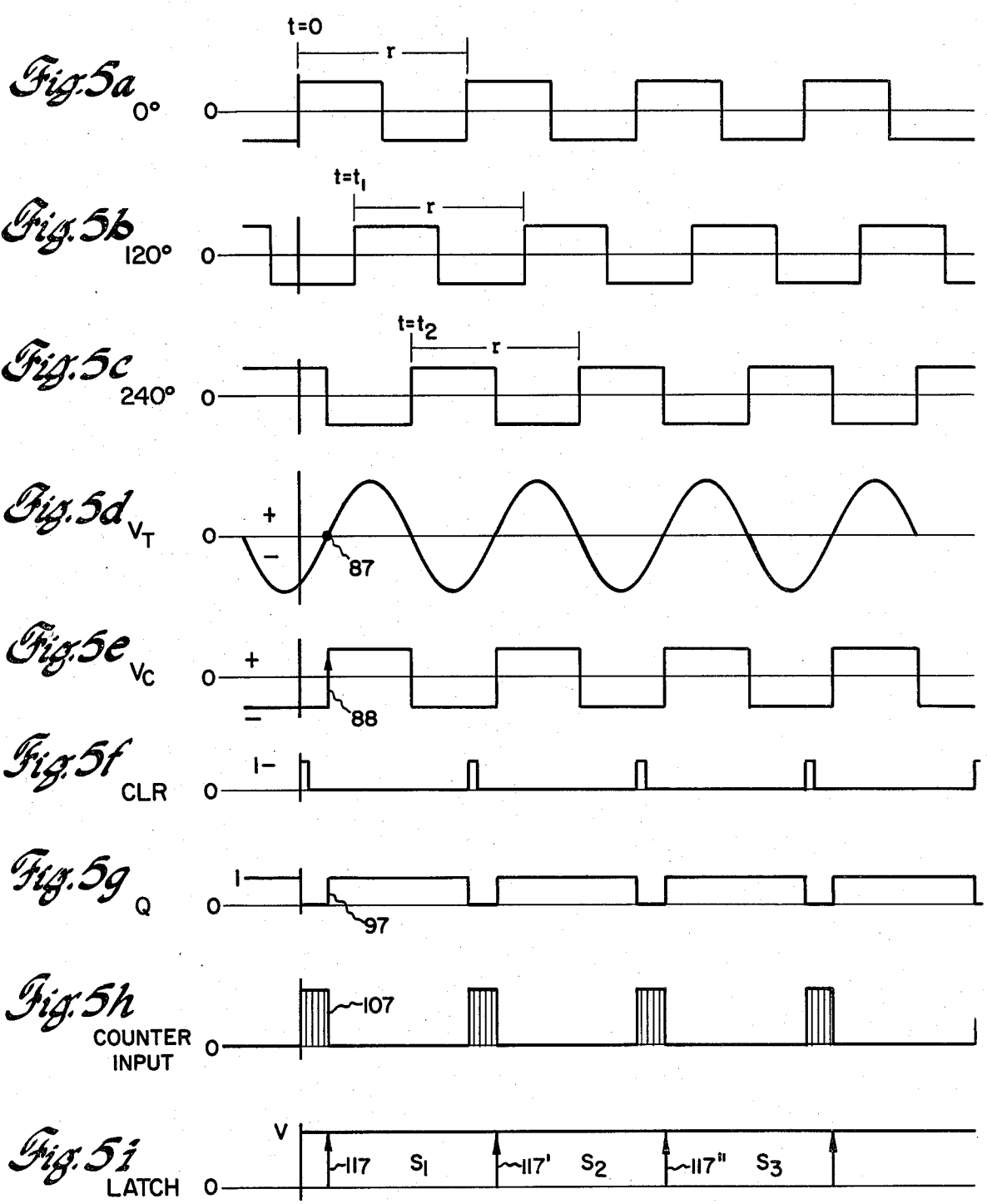

CAPACITIVE TOUCH CONTROL AND DISPLAY

BACKGROUND OF THE INVENTION

This application is a continuation-in-part of application Ser. No. 879,368, filed Feb. 21, 1978, now U.S. Pat. No. 4,158,216.

The present invention is directed toward control system data entry apparatus and, more particularly, to a novel capacitive touch entry control which can be fabricated upon a solid panel without the need for forming openings through the panel.

It has been found desirable to use capacitive touch entry controls in the electronic control systems of many types of apparatus, and particularly with home appliances. Such capacitive touch entry controls have the advantage of relatively low cost and ease of fabrication, but have the disadvantage of requiring a relatively large panel area if a fine analog setting must be provided. Accordingly, a capacitive touch entry control facilitating a fine degree of manual control is desirable.

BRIEF SUMMARY OF THE INVENTION

In accordance with the invention, a capacitive touch control, capable of fabrication upon a solid insulative panel, utilizes a plurality of sector-shaped input electrodes, each forming one side of a like multiplicity of capacitive input receptors, circularly arranged about a central disk electrode. The input electrodes and the disk electrode are fabricated upon the surface of the panel facing the interior of the equipment. A disk is attached to the remaining (exterior-facing) surface of the panel, with its center along the same central axis as the disk electrode and the circle of input electrodes. A control knob is provided having a recess in which is attached a member; the control knob recess is fitted over the disk with one of the disk and the member being magnetized and the other being fabricated of a magnetically attracted material, whereby the control knob is held to the front of the panel by magnetic attraction. A rear surface of the control knob supports a sector-shaped electrode, which is rotatably alignable to overlap any one of the plurality of input electrodes or portions of adjacent electrodes, to affect the effective capacity between the disk electrode and each of the plurality of input electrodes.

In a preferred embodiment of the present invention, three 120° sector-shaped input electrodes are utilized with a three-phase driving circuit. The position of the control is indicated by a light-emitting display formed by a plurality of light-emitting areas disposed about the major portion of the circumference of a circle having the same center as the central axis of the control and having the light emitting areas positioned at a distance therefrom to be visible, when viewed from the control-knob-bearing side of the panel, beyond the control knob periphery. A digitized display may be utilized in parallel connection with the peripheral display, or in lieu thereof.

Accordingly, it is an object of the present invention to provide a novel multi-phase capacitive touch control which may be utilized without providing openings through a panel to which the control is attached.

It is another object of the present invention to provide a novel multi-phase capacitive touch control utilizing magnetic attraction for maintaining the control knob upon a panel.

It is still another object of the present invention to provide a novel multi-phase capacitive touch control having a light-emitting display indicative of the control knob position.

These and other objects of the present invention will become apparent to those skilled in the art upon consideration of the following detailed description taken in conjunction with the drawings.

DESCRIPTION OF THE DRAWINGS

FIG. 1 is an exploded perspective view of one presently preferred embodiment of a novel capacitive touch control in accordance with the principles of the present invention;

FIG. 2 is a sectional side view of the novel capacitive touch control along line 2—2 of FIG. 1;

FIG. 3 is a rear view of the control knob utilized in the touch control;

FIGS. 5a–5i are a set of coordinated signal waveforms illustrative of operation of the circuitry of FIG. 4.

DETAILED DESCRIPTION OF THE INVENTION

Figure 4:
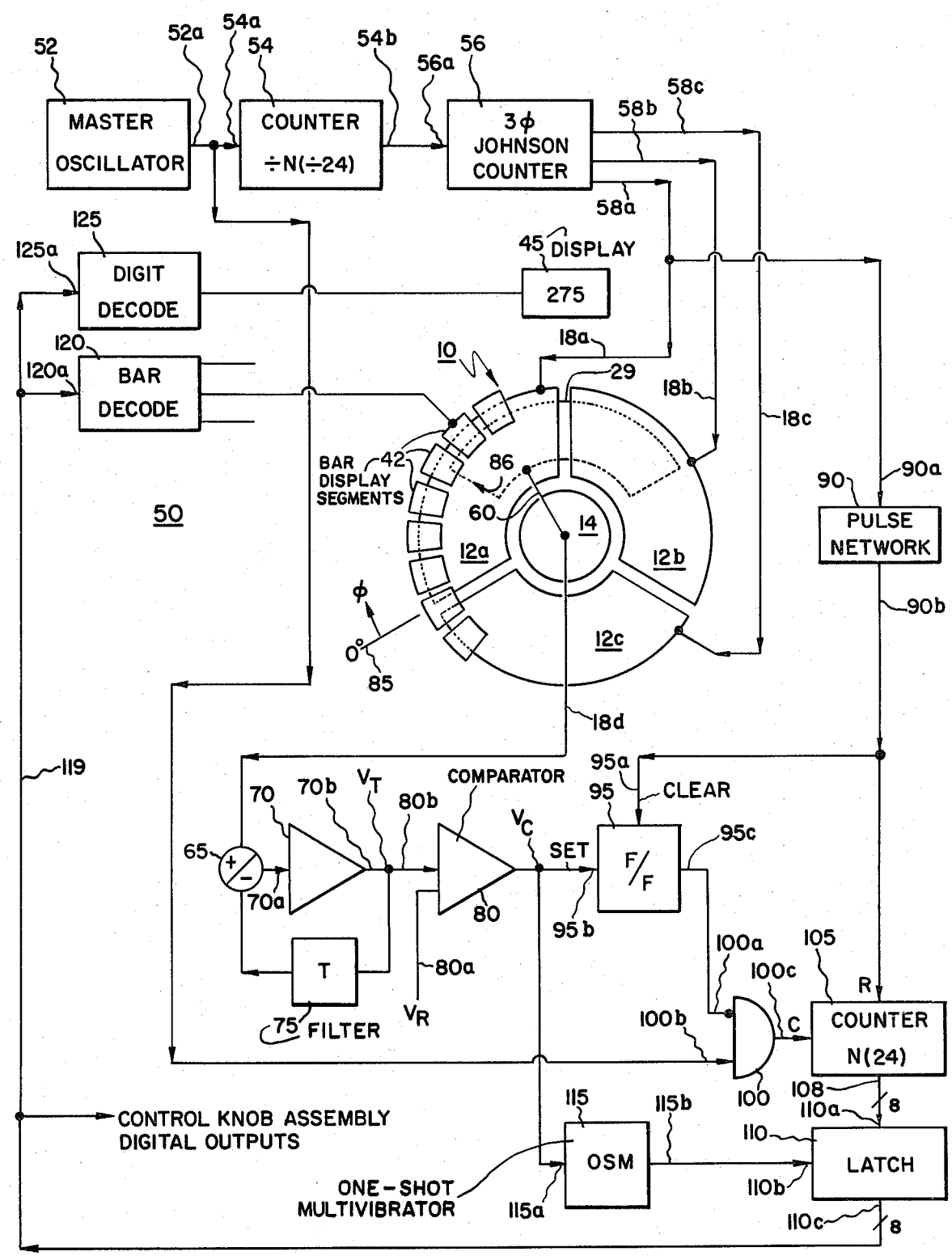
FIG. 4 is a schematic block diagram of electronic circuitry for use in the present invention for ascertaining the position of the control and for displaying positional data.

Referring now to FIGS. 1–3, a novel capacitive touch control 10 is fabricated upon the opposed surfaces 11a and 11b of a panel 11 formed of a substantially transparent and insulative material, such as glass, plastic and the like. Typically, apparatus (not shown) behind panel surface 11b carries electrical potentials and currents hazardous to the safety of personnel; the insulative panel 11 is interposed between this apparatus and such personnel, whereby the user has ready access only to the forward surface 11a of the panel. It will be appreciated that openings in panel 11, even for the purpose of allowing control knobs to protrude therethrough, is undesirable, as are actual protrusions of any conductive material from the space behind panel surface 11b into the space forward of panel surface 11a. Accordingly, panel 11 is preferably a solid and unbroken panel.

A plurality of sector-shaped conductive input electrodes 12a–12c (for example, the three 120°-sector pads illustrated in the drawings) are positioned in spaced-apart manner each from the other and about a central disk electrode 14. Each sector-shaped electrode extends radially from a common center, i.e. the center line 16 of disk electrode 14 and hence, of touch control 10 (as particularly shown in FIG. 1). Each of the input electrodes 12a–12c and the central disk electrode 14 has a separate electrical lead 18a–18d, respectively, extending therefrom to circuitry (described hereinbelow) for recognizing a change in capacitance differentially between each of the input electrodes and a control knob output; each of leads 18a–18d is routed in such manner as to be insulated from each of the remaining leads, and may typically comprise a conductive film plated upon rear surface 11b of the substantially transparent panel. Advantageously, the leads will themselves be of a light-transmissive material, such as tin oxide or indium oxide and the like. It should be understood that, while three input electrodes 12a–12c are illustrated herein, a minimum of two such electrodes or any greater number of input electrodes may be equally as well utilized without departing from the concept and intent of the present invention.

A small, relatively thin disk 20 of a magnetically-attracted material, such as soft steel and the like, is cemented to the front surface 11a of the insulative sheet, with its center lying on the center line 16 of the touch control. Disk 20 has a diameter D and a thickness T, selected as hereinbelow explained.

A control knob assembly 25 comprises a radially symmetric knob 26, which may have a somewhat tapered forward portion 26a having a surface with knurled, fluted or the like formations for aiding manual rotation of the knob, and may have a rear portion 26b formed as a flared skirt having a diameter greater than the greatest diameter of forward portion 26a. The rear surface 26c of the knob is an essentially flat surface, substantially transverse to the axis of rotation of the knob, which axis of rotation will be positioned to coincide with the center line 16 of the touch control. A recess 27, of diameter D', and a depth S is formed into knob rear surface 26c, with its center along the center of rotation of the knob. A magnetized member 28, preferably formed into a thin cylindrical shape, is inserted into recess 27 and fastened, by suitable means, therein. It should be understood that member 28 may be molded into knob recess 26 and may be formed of a magnetically-attracted material if disk 20 is formed of a magnetized material. Advantageously, the diameter D' of the recess is slightly larger than the diameter D of disk 20 cemented to the panel front surface 11a and magnetized member 28 also advantageously has a thickness selected such that the sum of the thicknesses of member 26 and disk 18 is slightly greater than the depth S of recess 24, whereby knob rear surface 26c is maintained adjacent to, but slightly spaced from, panel forward surface 11a, when the knob recess 27 is fitted over disk 20 and the knob assembly is held to the panel by the magnetic attraction between member 28 and disk 20. Knob assembly 25 is thus rotatable about the control centerline 16.

A sector-shaped conductive electrode 29 is molded into the skirt portion 26b of the knob and is substantially flush with knob rear surface 26c. Electrode 29 radially extends from the knob (and control) centerline for a distance sufficient to allow the electrode to overlap portions of at least one of input electrodes 12a–12c fabricated upon the oposite surface of panel 11, when knob 20 is rotated. The angular dimension θ is established by the number N of input electrodes and N is substantially equal to (360/N) degrees. Electrode 29 is electrically connected, via lead 30, to conductive member 28, which conducts to the disk 20 on panel surface 11a. Disk 20 is capacitively coupled to disk electrode 14 on panel surface 11b. The associated electronics will advantageously cycle a signal to each of input electrode leads 18a–18c to determine the amount of overlap of electrode 29 over each of input electrodes 12a–12c and hence the position at which the knob electrode 29 is presently aligned, and will affect, in accordance with the position of the knob electrode, control of the function associated therewith.

The control knob assembly 25 may bear an appropriate index marking, typically radially disposed upon the skirt portion 26b thereof immediately over the center of electrode 29, to serve as an indication of control knob position, and utilized in conjunction with reference points, marks and/or graduations upon panel 11. In one preferred embodiment, however, a substantially circular light-bar display 40 is utilized to follow movement of the control knob assembly 25. The light-bar assembly, which may be of the gas discharge, liquid crystal or other electroluminescent type, has a multiplicity of arcuate segments 42 consecutively arranged about the periphery of a major portion of a circle, centered upon the capacitive touch control central axis, i.e., center line 16. The segments 42 have maximum and minimum radii respectively somewhat greater than, and approximately equal to, the maximum radius of the skirt portion 26b of the control knob assembly, whereby the electrically-induced luminescence (shown as lighted area 44 in FIG. 1) is visible adjacent the edge of the control knob assembly, when the user is viewing panel front surface 11a. A typical type of light-bar display 40, and the electronics required to actuate the same in multiplexed manner, may be as described in U.S. Pat. No. 4,060,801, incorporated herein by reference. Alternatively, a linear light-bar, such as is shown in the aforementioned U.S. Patent, can be utilized adjacent the capacitive touch control assembly, particularly in crowded control panel areas where control knobs are grouped with relatively small spacing therebetween, such that a circular light-bar indicator might be substantially blocked from the view of the user. Preferably, at least one reference point, such as an "OFF" marking (not shown for reasons of simplicity) will be utilized to facilitate rapid recognition by the user of at least the control starting position. Alternatively, a digital display 45 (FIG. 4) may be used (as hereinbelow explained) and may be positioned upon the panel at a convenient location, which may be remote from the control knob assembly.

The knob of the capacitive touch control is easily removed by exerting sufficient force outward from panel face 11a to overcome the magnetic attraction between magnetized member 28 and magnetically-attracted disk 20. Advantageously, the amount of removal force (and, conversely, the amount of attracted force holding the knob to the panel) can be adjusted by selection of the proper magnetized and magnetically attracted materials and the size of the member 28 and disk 20.

Considering now FIGS. 4 and 5a–5i, the control knob system includes in addition to control knob assembly 10, electronic circuitry 50 for recognizing the rotational position of the control knob. A master oscillator 52 produces, at its output 52a, a waveform of substantially constant frequency F. Oscillator output 52a is coupled to the counting input 54a of a counter 54 which divides the oscillator frequency F by an integer value N, where N is chosen in accordance with the angular resolution required of the control knob. In the illustrated embodiment, N=24 to achieve control knob increments of (360°/24) or 15°. It should be understood that a lesser or greater number of angular setting increments is achievable by respectively decreasing or increasing the division ratio of counter 24; e.g. for angular increments of 10°, N=(360°/10°)=36, or by changing parameters of decoding devices 120 and 125. A counter output 54b provides a square wave of frequency F'(=F/N) with one output cycle occurring for every N cycles of the master oscillator. Counter output 54b is coupled to the input 56a of an M-phase Johnson counter 56, which may be designed in accordance with the description at pages 125 and 126 of the "RCA COS (MOS Integrated Circuits Manual" 1972). The number of phases M is equal to the number of sectors 12 utilized in the control knob assembly; in the illustrated embodiment, three sectors, each substantially subtending 120°, are used. Thus, M=3 and a three-phase Johnson counter is utilized. The counter has a plurality of outputs 58a–58c, equal in number to the number of sectors 12 utilized; in the illustrated embodiment, three outputs provide three square-wave signals. Each signal is at the same frequency F' and the signals are offset from one another by 120°, i.e. the 360° in a full cycle divided by the number M of segments, e.g. three. Thus, a first output 58a, provides a first square-waveform (FIG. 5a) having a rising edge transition at some time t=0 and having a one-cycle time interval $\tau$ equal to the reciprocal of the frequency (F/N) at counter input 56a, e.g. $\tau = N/F$). The second counter output 58b waveform (FIG. 5b) has the same one-cycle time interval $\tau$, but has its rising edge at a time $t=t_1$, which rising edge occurs one-third of the time interval $\tau$ after the rising edge of the zero degree waveform of FIG. 5a. The third counter output 58c waveform is (FIG. 5c) a square wave of similar time interval $\tau$ and has its rising edge occurring at a time $t=t_2$, delayed by two-third of a cycle from the rising edge of the zero degree output 58a. Thus, for general, M-sectored control knob assembly, the M outputs of the M-phase Johnson counter will have a square wave of the same frequency (and hence the same one-cycle time duration) with the rising edge of each successive output being delayed by (360/M) degrees from the rising edge of the preceding output.

The 0° counter output 58a is coupled to lead 18a connected to first sector 12a, while the 120° output 58b is coupled to lead 18b connected to second sector 12b, and the 240° output 58c is coupled to lead 18c connected to sector 12c. Rotatable sector-shaped electrode 29 is conductively coupled to the magnetized disk 28 (FIG. 2) in the control knob and is conductively coupled to the magnetizable disk 20 upon the front surface of the panel; disk 20 is capacitively coupled to disk electrode 14, which is itself connected to lead 18d. Thus, there is effectively an electrical connection 60 between knob electrode 29 and output lead 18d. Output lead 18d is coupled to the positive (+) port of a summing junction 65 at the input 70a of a high-gain operational amplifier 70. The operational amplifier output 70b is coupled to a negative (−) port of the summing junction 65 through a "T", or notch, filter 75. The frequency of the T-notch filter is set equal to the master oscillator frequency divided by the division modulus N of counter 54, i.e. the T-notch frequency equals F/N, whereby the output voltage $V_T$ (FIG. 5d) of amplifier 70 is a sinusoidal voltage recovered from the fundamental frequency of the multi-phased, single-frequency square-waves differentially capacitively coupled from the various sector electrodes 12a–12c, to movable electrode 29 and to summing junction 65. A comparator 30 receives a reference voltage $V_R$ at a first input 80a and receives the T-notch amplifier output voltage $V_T$ at a second input 80b. The reference voltage $V_R$ is advantageously established such that the output voltage $V_C$ (FIG. 5e) of the comparator changes polarity when the T-notch filter output voltage $V_T$ crosses the zero voltage level. Illustratively, a 0° reference position 85 is established at one end of sector electrode 12a, with angular rotation $\phi$ being read in a clockwise direction between the reference mark 85 and a similar, imaginary reference 86 considered to be on the end of movable electrode 29 adjacent the zero reference when the movable electrode 29 completely overlaps the sector 12a receiving the zero degree phase signal from counter 56. The illustrated waveforms are for the case in which movable electrode 29 has been rotated by an angle $\phi = 60°$ from zero reference 85. Thus, the T-notch output voltage waveform has a zero crossing point 87 after a time interval equal to one-sixth of a cycle with respect to time $\tau = 0$ (as the movable electrode angular displacement is 360°/60° = 1/6). Immediately prior to $V_T$ zero crossing 87, the comparator output voltage $V_C$ is negative, indicative of the filter output voltage $V_T$ being less than zero, with a positive transition 88 occurring in voltage waveform $V_C$ essentially coincidental with zero crossing 87 initiating a positive excursion of filter output voltage $V_T$.

A pulse network 90 has its input 90a coupled to the zero-degree-phase counter output 58a and provides, at a network output 90b, a short duration clear (CLR) pulse (FIG. 5f) at the occurrence of each leading edge of the zero-degree-phase square-wave from counter 56. The CLR pulse is coupled to a CLEAR input 95a of a flip-flop (F/F) 95, receiving the comparator output voltage waveform $V_C$, as a SET input 95b thereof. The flip-flop output 95c has a waveform Q (FIG. 5g) which is cleared to a substantially zero-voltage value upon receipt of the CLR output of network 90, i.e. at time $\tau = 0$, and which remains at a zero level until the output is set to a logic-one level by the positive-going transition 88 of the comparator output waveform $V_C$. Thus, in the illustrative example, the transition 97 of the Q waveform from a logic-zero level to a logic-one level, occurs essentially with a 60° difference from the $\tau = 0$ commencement of the zero-degree-phase waveform. The flip-flop output waveform is maintained at a logic-one level until subsequently cleared by the presence of another CLR pulse at CLEAR input 95a, coincident with the next rising edge of the zero-degree-phase waveform.

The flip-flop output waveform is inverted at a first input 100a of a two-input AND gate 100, having a remaining, non-inverting input 100b coupled to the output 52a of the master oscillator. The output 100c of gate 100 is coupled to the counting input C of a count-to-N counter 105. The maximum count N of the counter 105 is equal to the division ratio N of counter 54, which in the illustrative example is N=24. Counter 105 also has a reset input R coupled to the input 98 of the pulse network. Thus, the pulse at network output 90b, occurring essentially at time $\tau = 0$, resets counter 105 to a count of zero, such that the Q input of the flip-flop, when inverted at gate input 100a, causes gate 100 to conduct and allow a number of master oscillator output pulses to be transmitted to the counter input C. The number of oscillator pulses gated to the counter increases for increasing time duration of the flip-flop Q output remaining at a logic-zero level (between resetting of the flip-flop by the CLR pulse and the appearance of the Q waveform rising edge transition 97.) The gating interval is thus proportional to the angular displacement of moveable electrode 29 from zero degree reference 85, and allows a gated "burst" 107 of master oscillator pulses (FIG. 5h) to appear at the counter counting input, after each zero-degree-phase rising-edge transition. The return of the F/F output to the logic-one level opens gate 100 and terminates transmittal of master oscillator pulses to the counter. A digital representation of the number of oscillator pulses gated into the counter is provided at counter outputs 108, which, in my preferred embodiment, is a set of 8 parallel output lines, coupled to the data inputs 11a of an 8-bit-wide date latch 110.

A one-shot-multivibrator (OSM) 115 has its trigger input 115a coupled to the comparator output and is triggered by the rising edge transition 88 of the $V_C$ waveform to provide a positive pulse 117 (FIG. 5i) at the OSM output 115b. The OSM output pulse is coupled to a control input 110b of latch 110, and causes the data appearing at data inputs 110a to be loaded into the latch and stored therein until receipt of a next subsequent control pulse 117' at control input 110b. Thus, digital data representative of the angular displacement between the imaginary zero angular reference point 85 and the imaginary removable electrode reference point 86 is presented, in sampled fashion, at latch outputs 110c.

In my preferred embodiment, the latched angular displacement data is routed, via an eight-bit-wide data bus 119 to the input 120a of a bar-decode circuit 120 and the input 125a of a digit-decode circuit 125. The decoders 120 and 125 recognize, via means known to the art, the particular digital data representations of the N possible positions to which the control knob electrode may be set, and cause an appropriate indication to be made visible. Thus, bar decode circuitry 120 is coupled to each of the illuminable segments 42 such that the appropriate one, or ones, of these segments will be illuminated to signify the present position of the movable electrode 29. Digit decoder circuitry 125 is coupled to digital display 45 to present a numerical indication of control knob setting (where the angular position of movable electrode 29 is related, in some desired manner, to some numerical criteria, such as the temperature setting for a cooking oven and the like). Data is coupled to additional circuitry (not shown for purposes of simplicity) from latch output 110c, or the outputs of either decoding circuitry 120 or 125, to initiate control of a parameter, such as the afore-mentioned temperature in an electrical cooking oven, by known means utilizing and processing the control knob digital outputs from latch outputs 110c. The latch outputs are held constant between each sampling acutation 117, whereby a first control knob assembly data sample $S_1$ appears at latch output 110c after a first latch control input 117 and is maintained until the next subsequent latch control input enablement 117' occurs. Similarly, immediately after latch control signal 117' occurs, the latch stores a second data sample $S_2$ indicative of the angular position of movable electrode 29 immediately prior to enablement signal 117'; sample $S_2$ is stored until the next subsequent enablement signal 117" enables a third sample $S_3$, and so forth.

While one preferred embodiment of the present invention have been described, many variations and modifications will now become apparent to those skilled in the art. In particular, input and movable electrodes of other than sector shapes may be utilized, especially to achieve highly linear phase versus rotation relationships. It is my intent, therefore, to be limited only by the scope of the appended claims, rather than by the illustrative embodiments described herein.

What is claimed is:

1. A capacitive control assembly for use on a solid panel having front and rear surfaces, comprising:
   a plurality (M) of input electrodes disposed about a common center and fabricated upon said panel rear surface; the centers of adjacent input electrodes separated from one another by an angle about said common center substantially equal to (360/M) degrees, where M is an integer greater than one;
   a movable electrode positioned adjacent to said panel front surface and rotationally alignable to overlap one portion of at least one of said input electrodes to vary the electrical capacitance between said movable electrode and those of said plurality of input electrodes overlapped by said movable electrode;
   first means for producing a train of pulse signals at a frequency F;
   second means receiving said train of pulses for producing a plurality (M) of square wave outputs each having a frequency (F') equal to (F/N), where N is an integer greater than one, and each successive one of said plurality of square waves having a phase difference of (360/M) degrees with respect to the next preceding and next subsequent square wave; each successive square wave output of said second means being coupled to a successive one of said plurality of input electrodes, commencing at a particular one of said input electrodes associated with said reference point;
   third means coupled to said movable electrode for recovering from the plurality of square waves capacitively coupled from said plurality of input electrodes a periodic waveform having a frequency equal to the frequency (F') of said square waves and crossing a predetermined level at a time, after a predetermined transition of the square wave coupled to the input electrode associated with said reference point, linearly related to the angular rotation of said movable electrode with respect to said reference point; and
   fourth means coupled to said first and third means for counting the pulses from said first means during the time interval between said predetermined transition and said predetermined level crossing to obtain a digital representation of the angular rotation of said movable electrode with respect to said reference point.

2. The control assembly as set forth in claim 1, wherein said second means comprises a M-phase Johnson counter.

3. The control assembly as set forth in claim 2, wherein the number M of input electrodes, and the number of phases in said Johnson counter, is three.

4. The control assembly as set forth in claim 2, wherein said second means includes a counter coupled between said first means and said Johnson counter for dividing by an integer N the number of pulses received by said Johnson counter from said first means.

5. The control assembly as set forth in claim 4, wherein N=24.

6. The control assembly as set forth in claim 1, wherein said third means comprises a comparator having a first input receiving a reference level and a second input receiving a signal from said movable electrode.

7. The control assembly as set forth in claim 6, wherein said third means further comprises fifth means coupled between said movable electrode and said comparator second input for recovering only the fundamental sinusoidal component of the signal from said movable electrode.

8. The control assembly as set forth in claim 7, wherein said fifth means comprises an operational amplifier having an output and a summing junction input connected to said movable electrode and T-notch filter coupled to provide negative feedback between said operational amplifier output and said summing junction input.

9. The control assembly as set forth in claim 1, wherein said fourth means includes means for counting at least N consecutive pulses;
   means for gating the pulse train from said first means to said counting means; and
   means for enabling said gating means only in the time interval between said predetermined transition and said predetermined level crossing.

10. The control assembly as set forth in claim 9, wherein said counting means is reset to a predetermined count at the occurrence of said predetermined transition.

11. A capacitive control assembly for use on a solid panel having front and rear surfaces, comprising:
   a plurality (M) of input electrodes disposed about a common center and fabricated upon said panel rear surface; the centers of adjacent input electrodes separated from one another by an angle about said common center substantially equal to (360/M) degrees, where M is an integer greater than one;
   a movable electrode positioned adjacent to said panel front surface and rotationally alignable to overlap one portion of at least one of said input electrodes to vary the electrical capacitance between said movable electrode and those of said plurality of input electrodes overlapped by said movable electrode;
   means connected to each of said plurality of input electrodes and to said movable electrode for recognizing a change in differential capacitance between the movable electrode and each of the plurality of input electrodes to determine the rotational position of said movable electrode with respect to a reference point;
   means magnetically attachable to and detachable from said panel front surface for supporting said movable electrode at a fixed distance parallel to said panel front surface during rotation of said movable electrode; and
   a disk electrode positioned upon said panel rear surface and within the annulus formed by said plurality of input electrodes, said disk electrode being capacitively coupled to said movable electrode through said supporting means and directly coupled to said capacitance recognizing means.

12. The control assembly as set forth in claim 11, wherein each of said input electrodes is sector shaped and subtends an angle, about said common center, substantially equal to (360/M) degrees.

13. The control assembly as set forth in claim 12, wherein said movable electrode has substantially the same size and shape as each of said input electrodes.

* * * * *